United States Patent
Kao

(10) Patent No.: US 8,487,662 B2
(45) Date of Patent: Jul. 16, 2013

(54) MULTIPLEXER

(75) Inventor: Shuo-Ting Kao, Hsinchu Hsien (TW)

(73) Assignee: MStar Semiconductor, Inc., Taiwan (TW)

(*) Notice: Subject to any disclaimer, the term of this patent is extended or adjusted under 35 U.S.C. 154(b) by 86 days.

(21) Appl. No.: 13/179,889

(22) Filed: Jul. 11, 2011

(65) Prior Publication Data

US 2012/0139608 A1    Jun. 7, 2012

(30) Foreign Application Priority Data

Dec. 6, 2010    (TW) ................................ 99142453 A

(51) Int. Cl.
G06F 1/08      (2006.01)

(52) U.S. Cl.
USPC ............. 327/99; 327/403; 327/404; 327/407; 327/408

(58) Field of Classification Search
USPC ............ 327/99, 403, 404, 407, 408; 370/388, 370/518, 537
See application file for complete search history.

(56) References Cited

U.S. PATENT DOCUMENTS

| | | | | |
|---|---|---|---|---|
| 4,692,634 A * | 9/1987 | Fang et al. | ..................... | 327/203 |
| 5,243,599 A * | 9/1993 | Barrett et al. | .................. | 370/541 |
| 5,438,295 A * | 8/1995 | Reddy et al. | ................... | 327/408 |
| 5,570,051 A * | 10/1996 | Chiang et al. | .................. | 327/203 |
| 6,768,338 B1 * | 7/2004 | Young et al. | .................... | 326/44 |
| 2004/0095181 A1 * | 5/2004 | Ohtsuka et al. | ............... | 327/408 |

\* cited by examiner

*Primary Examiner* — Lincoln Donovan
*Assistant Examiner* — Jung H Kim
(74) *Attorney, Agent, or Firm* — Han IP Law PLLC

(57) ABSTRACT

A multiplexer is provided. The multiplexer includes an output coupled to a complementary driving unit and a plurality of switch circuits. Each switch circuit includes a channel unit and two switches. The two switches respectively conduct two input signals to a channel end of the channel unit during different switch conduction periods, and the channel unit conducts the channel end to an output end during a channel conduction period. The switch conduction period of the first switch in the first switch circuit equals the switch conduction period of the second switch circuit, the switch conduction period of the second switch in the second switch circuit equals the switch conduction period of the first switch circuit, and the first and second switches are coupled to the same input signal.

11 Claims, 11 Drawing Sheets

MULTIPLEXER

CROSS-REFERENCE TO RELATED PATENT APPLICATIONS

This patent application claims priority to Taiwan Patent Application No. 099142453, filed Dec. 6, 2010, the subject matter of which is incorporated herein by reference.

BACKGROUND

1. Technical Field

The present disclosure relates in general to a multiplexer, and more particularly to a multiplexer for multiplexing high-speed signals.

2. Description of the Related Art

A multiplexer is utilized for selecting from multiple input signals one signal as an output signal, and is extensively applied in various fields. For example, in a modern electronic system, multiple parallel signals are converted to a serial signal to reduce hardware cost in signal transmission. When converting multiple parallel signals, a multiplexer cyclically selects the parallel signals one after another, so that data corresponding to individual parallel signals becomes a serial arrangement in the serial signal outputted by the multiplexer.

SUMMARY

With the ever-growing increase in operating clocks in electronic systems, speed, timing and frequency (e.g., bit count within unit time) of electronic signals also become greater. A designed of a multiplexer is targeted at multiplexing high-speed electronic signals. For example, supposing a multiplexer is to convert N parallel signals of frequency f (i.e., a duration of data of each bit in input data is 1/f) to a serial output signal, a frequency of the output signal is multiplied to N*f. That is, it is essential that the multiplexer have an excellent response speed for handling the multiplied frequency requirement.

According to an aspect the present invention, a multiplexer for providing an output signal according to N input signals is provided. In an embodiment, the multiplexer is a differential multiplexer, which switches between N pairs of input signals D(0)/Db(0) to D(N−1)/Db(N−1) to provide a pair of differential output signals Dout/Doutb. The multiplexer comprises N switch circuits, N differential switch circuits, an output, a differential output and two complementary driving units.

Each switch circuit dx(n) comprises a channel unit M(n) and two switches sa(n) and sb(n). The channel unit M(n) comprises a first channel end and a second channel end, and conducts the first channel end to the second channel end during a channel conduction period. The first channel end is coupled to the output. The switches sa(n) and sb(n) respectively correspond to input signals D(n) and D(n+1). For n=(N−1), the input signal D(n+1) is the input signal D(0). Each of the switches sa(n) and sb(n) comprises two transmission ends, and conducts the two transmission ends during two different switch conduction periods. The switches sa(n) and sb(n) respectively have one transmission end coupled to the second channel end of the channel unit M(n), and the other transmission end respectively coupled to the corresponding input signals D(n) and D(n+1). The switch conduction period of the switch sa(n) overlaps with the channel conduction period of the channel unit M(n), the switch conduction period of the switch sb(n) overlaps with the channel conduction period of the channel unit M(n), and the switch conduction period of the switch sa(n) does not overlap with that of the switch sb(n).

After multiplexing performed by the multiplexer, the output signal comprises a plurality of one-bit data each corresponding to a bit period. In one embodiment, the switch conduction period and the channel conduction period are respectively equal to twice the bit period. Also the overlap part of switch conduction period and the channel conduction period is one bit period. Further, each bit input data in the input signal corresponds to N bit periods.

In one embodiment, the channel unit M(n) further comprises a controlled end for receiving a channel clock. The channel clock cyclically alternates between a first level and a second level. Each of the switches sa(n) and sb(n) further comprises a switch end for receiving a corresponding switch clock. The switch clock cyclically alternates between a third level and a fourth level (e.g., the third level and the fourth level respectively equal to the first level and the second level). Periods during which the switch clocks of the switches are maintained at the third level are respectively switch conduction periods of the switches.

The switch clock of the switch sa(n), the channel clock of the channel unit M(n) and the switch clock of the switch sb(n) may respectively be CK(n−1), CK(n) and CK(n+1). For example, a cycle of the clock CK(n) comprises N bit periods, begins at a bit 0 period and ends at a bit (N−1) period, and is kept at the first level during bit p and bit q periods and at the second level during other periods; wherein p and q are respectively remainders of n and (n+1) divided by N. That is, the cycles of the clocks CK(n−1), CK(n) and CK(n+1) are the same but have different phases. For n=0, the clock CK(n−1) is the clock CK(N−1); for n=(N−1), the clock CK(n+1) is the clock CK(0).

With the above clock arrangement, for the switch circuit dx(n), the channel unit M(n) conducts the switch sa(n) to the output according to the clock CK(n), and the switch sa(n) conducts the input signal D(n) to the channel unit M(n) according to the clock CK(n−1); for the switch circuit dx(n−1), the channel unit M(n−1) conducts the switch sb(n−1) to the output according to the clock CK(n−1), and the switch sb(n−1) conducts the input signal D(n) to the channel unit M(n−1) according to the clock CK(n). That is, the channel conduction period of the switch circuit dx(n−1) equals the switch conduction period of the switch sa(n) in the switch circuit dx(n), and the channel conduction period in the switch circuit dx(n) equals to the switch conduction period of the switch sb(n−1) in the switch circuit dx(n−1). For n=0, the switch circuit dx(n−1) is the switch circuit dx(N−1).

Therefore, in a bit period during which the clock CK(n−1) overlaps with the clock CK(n), the input signal D(n) is transmitted to the output via two paths, one of which being from the switch sb(n−1) to the channel unit M(n−1) and the other being from the switch sa(n) to the channel unit M(n). The equivalent impedance (resistance) of the two paths is connected in parallel to form a low impedance to reduce transmission delay and increase a response speed of the multiplexer of the present invention. Further, before the period during which the clock CK(n−1) overlaps with the clock CK(n), one of the switches sa(n) and sb(n−1) already transmitted the input signal D(n) to a corresponding channel unit to pre-charge the channel unit, so that the path of the switch and the corresponding channel unit is able to in advance reflect content of the input signal D(n) to again enhance the high-speed signal multiplexing performance of the multiplexer of the present invention. In addition, the channel conduction period of each channel unit M(n) is twice the bit period and thus the channel conduction period need not be compressed to be within a single bit period.

Based on the symmetrical structure of a differential arrangement, each of the switch circuits dx(n) corresponds to a differential switch circuit dxb(n). The differential switch circuit dxb(n) comprises a channel unit Mb(n) and two switches sc(n) and sd(n). The channel unit Mb(n) comprises two channel ends, one of which being coupled to the differential output and the other being coupled to the switches sc(n) and sd(n). The channel unit Mb(n) conducts the two channel ends according to the clock CK(n). The switch sc(n) transmits an invert signal Db(n) of the input signal D(n) to the channel unit Mb(n) according to the clock CK(n−1), and the switch sd(n) transmits an invert signal Db(n+1) of the input signal D(n+1) to the channel unit Mb(n) according to the clock CK(n+1).

In one embodiment, the channel units M(n) and Mb(n) of the multiplexer may be realized by transistors of a same channel type, for example, MOS transistors; and the two complementary driving units may be realized by complementary MOS transistors. For example, the controlled end of the channel units M(n) and Mb(n) is a gate of the transistors, and the two channel ends are respectively a source and a drain. Each of the complementary driving units comprises a controlled end (e.g., a gate), and a channel end (e.g., a drain). One of the complementary driving units has its controlled end and channel end respectively coupled to the output and the differential output, and the other has its controlled end and channel end respectively coupled to the differential output and the output. The other channel end of the complementary driving units is coupled to an operating voltage. Based on the structure of complementary transistor pairs adopted by the multiplexer of the present invention, not only power consumption is reduce, but also the output signal has a greater swing magnitude which can be kept consistent with that of the input signals.

The above and other aspects of the invention will become better understood with regard to the following detailed description of the preferred but non-limiting embodiments. The following description is made with reference to the accompanying drawings.

DETAILED DESCRIPTION OF THE PREFERRED EMBODIMENTS

Figure 1:
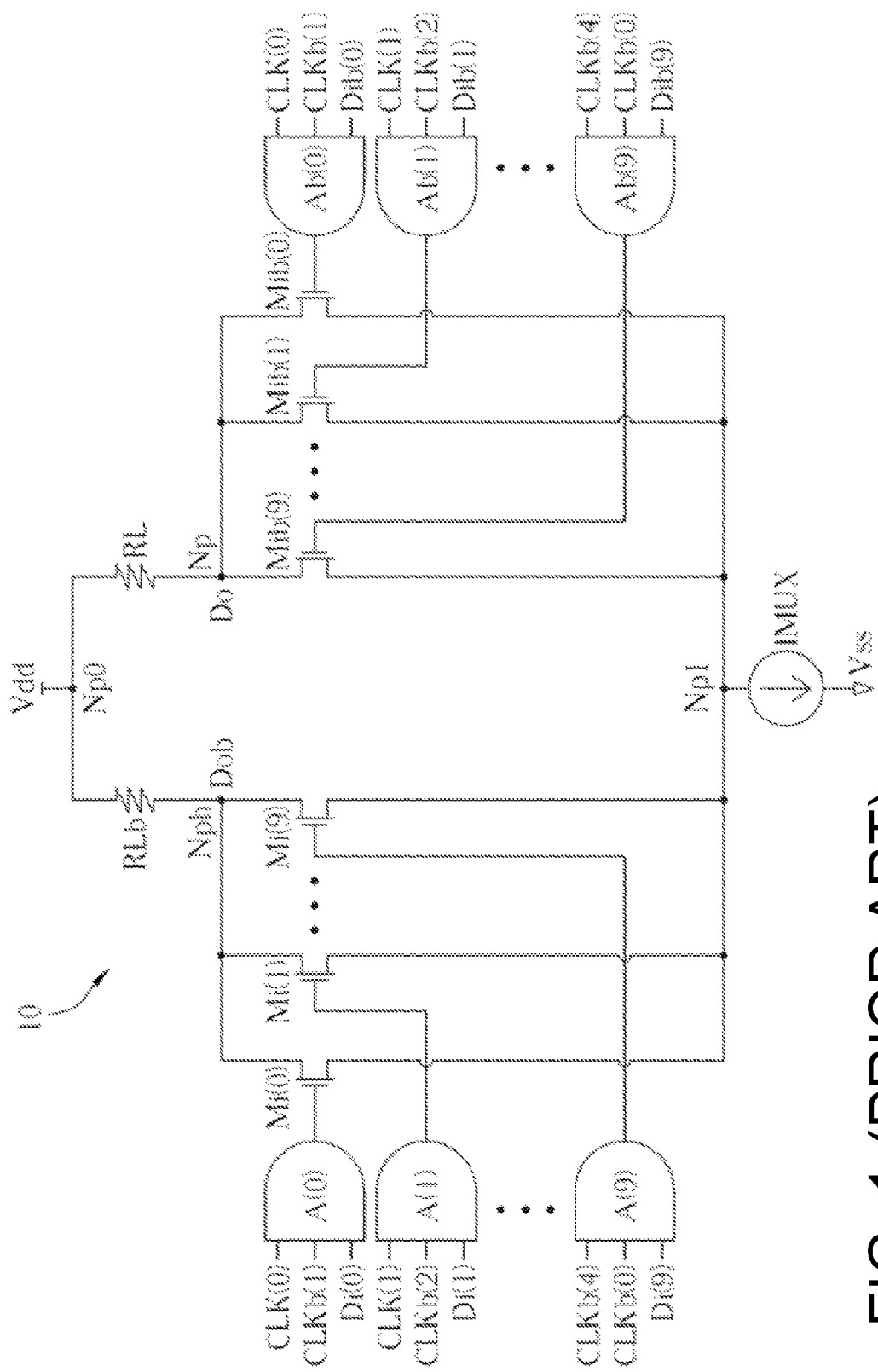
FIG. 1 is schematic diagram of a conventional multiplexer.
Figure 2:
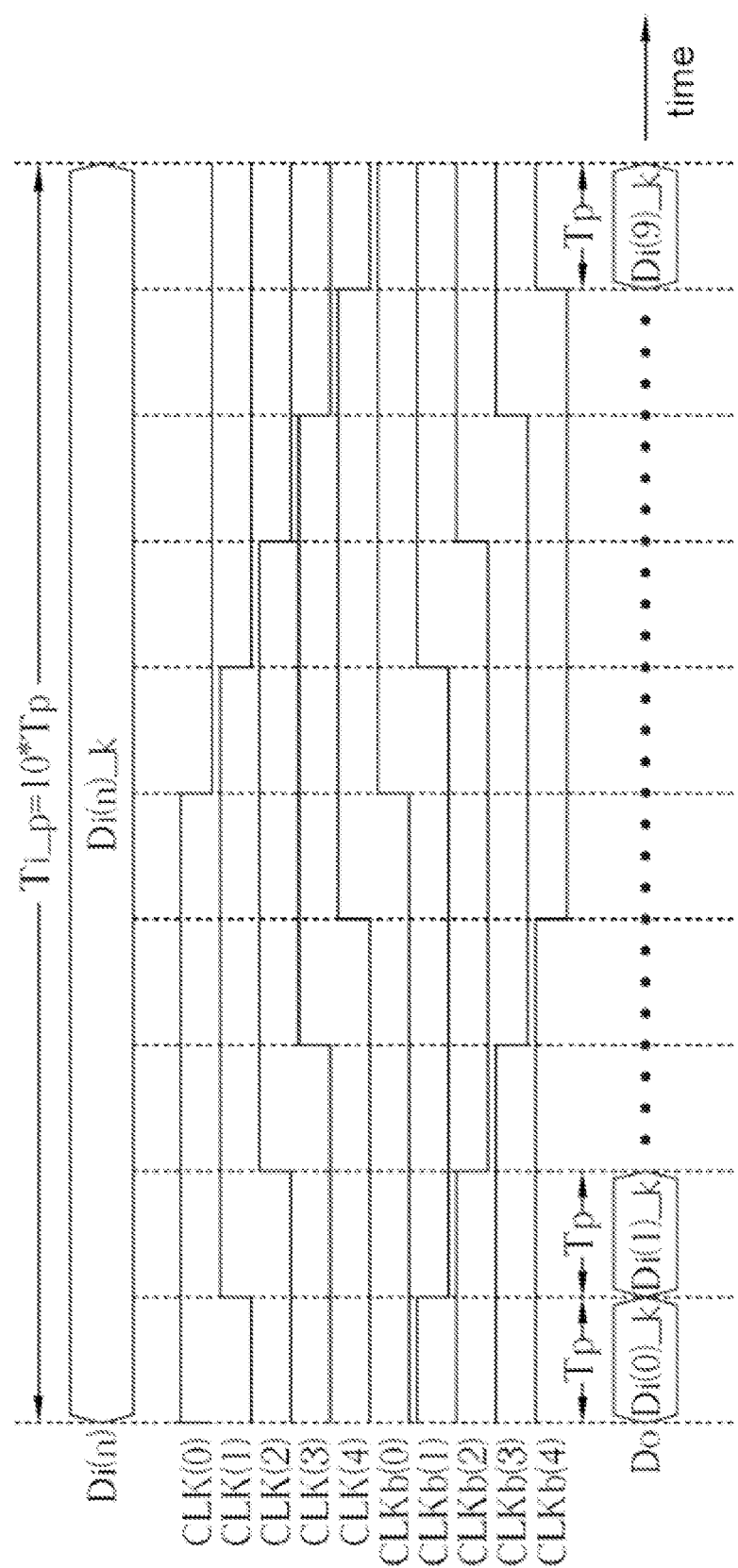
FIG. 2 is a timing diagram of signals and clocks associated with the multiplexer in FIG. 1.

FIG. 1 shows a multiplexer 10, and FIG. 2 shows a timing diagram of clocks of signals associated with the multiplexer 10. The multiplexer 10 is a differential multiplexer, which respectively provides a pair of differential output signals Do/Dob at nodes Np and Npb according to 10 pairs of input signals Di(0)/Dib(0) to Di(9)/Dib(9). Each pair of differential input signals Di(n) and Dib(n) is invert to each other (n=0 to 9), and output signals Do and Dob are also invert to each other.

Based on the symmetrical differential circuit structure, the multiplexer 10 comprises two matching resistors RL and RLb, AND gates A(0) to A(9) and Ab(0) to Ab(9), transistors (e.g., NMOS transistors) Mi(0) to Mi(9) and Mib(0) to Mib(9), and a current source IMUX for providing a current. For n=0 to 9, the AND gate A(n) receives the input signal Di(n) and two clocks, and determines whether the input signal Di(n) can be transmitted to a gate of the transistor Mi(n). The transistor Mi(n) has its drain and its source respectively coupled to the nodes Npb and Np1. To correspond to the arrangement of the AND gate A(n), the AND gate Ab(n) also determines whether the invert signal Dib(n) of the input signal Db(n) can be transmitted to the gate of a transistor Mib(n). The AND gate Ab(n) and the AND gate A(n) operate based on two same clocks. The transistor Mi(n) has its drain and its source respectively coupled to the nodes Np and Np1. The resistor RLb is a load of the transistor Mi(n), and is coupled between an operating voltage Vdd and the node Npb; the resistor RL is a load of the transistor Mib(n), and is coupled between the operating voltage Vdd and the node Np.

With reference to FIG. 2, the AND gates A(0) to A(9) and Ab(0) to Ab(9) determine whether the corresponding input signals Di(0) to Di(9) and Dib(0) to Dib(9) can be transmitted to the transistors Mi(0) to Mi(9) and Mib(0) to Mib(9) according to the clocks CLK(0) to CLK(4) and the invert clocks CLKb(0) to CLKb(4). The clock CLK(m) and the clock CLKb(m) (m=0 to 4) are invert to each other, with their clock period Ti_p corresponding to one bit Di(n)_k of the input data Di(n). For example, when the clocks CLK(0) and CLKb(1) are at a high level of logic 1, the AND gate A(0) transmits the input signal Di(0) to the gate of the transistor Mi(0).

Detailed operations of the multiplexer 10 are described below. When the clocks CLK(0) and CLKb(1) are at a high level of logic 1, the AND gates A(0) and Ab(0) respectively transmit input signals Di(0) and Dib(0) to the gates of the transistors Mi(0) and Mib(0). When the input data Di(0)_k of the input signal Di(0) is logic 1, the transistor Mi(0) conducts a current so the voltage at the node Npb gets lower, so that the output signal Dob at the node Npb is at logic 0; thus the transistor Mib(0) is turned off, and the voltage at the node Np is maintained at the operating voltage Vdd to provide the output signal Do at logic 1 at the node Np. Similarly, when the clocks CLK(1) and CLKb(2) are both at a high level of logic 1, the AND gates A(1) and Ab(1) and the transistors Mi(1) and Mib(1) serialize the input data Di(1)_k in the input signal Di(1) to the output signal Do. As shown in FIG. 2, within a period Ti_p, the input data Di(0)_k to Di(9)_k in the input signals Di(0) to Di(9) are activated in sequence in order to output to the output signal Do following the timings of the clocks. In the output signal Do, a duration of the input data Di(n)_k is a bit period Tp, and the bit period is 1/10 of the period Ti_p.

Therefore, during each cycle Ti_p, the gate A(n) transmits the corresponding input data Di(n) to the corresponding transistor Mi(n) within one bit period, and, in the remaining 9 bit time Tp, the input data Di(n) is excluded from input to the transistor. More specifically, it is necessary that the transistor Mi(n) reacts spontaneously in order to selectively conduct the node Npb to the current source IMUX depending on the input data Di(n) at the beginning of a bit period Tp, and to gate out the input data Di(n) before that same bit period Tp ends. Because response time of the transistor Mi(n) is compressed to one bit period, a response speed of the transistor Mi(n) is an operational bottle-neck of the multiplexer 10—it is often that the multiplexer 10 fails to normally function due to the lack of speed in conduction response.

Further, the multiplexer 10 is a current-driven structure, such that the magnitude of swings of the output signals Do/Dob is reduced, which result in inconsistency with the magnitude of the input signals Di(n)/Dib(n). The input signals Di(n)/Dib(n) can present logic 0 by receiving low operating voltage Vss; however, the output signals Do/Dob cannot present logic 0 by low voltage for that the multiplexer 10 adopts the current source IMUX, thus, this design again undesirably affects a noise margin of the multiplexer 10. In addition, in the multiplexer 10, logic 0 is presented by a cross voltage between the resistors RL/RLb, meaning that power is continuously consumed to depreciate operation efficiency of the multiplexer 10.

Figure 3:
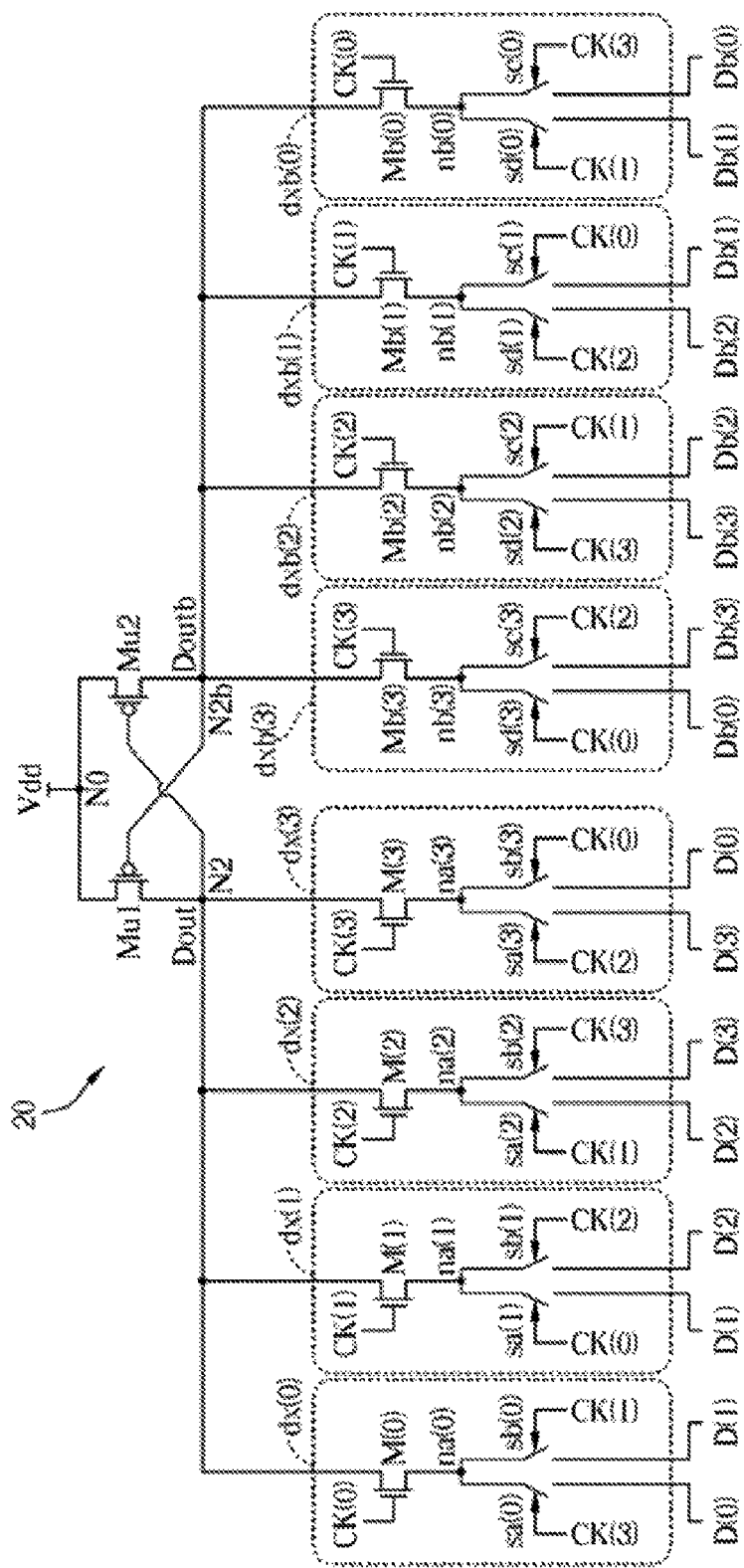
FIG. 3 is a schematic diagram of a multiplexer according to an embodiment of the present invention.
Figure 4:
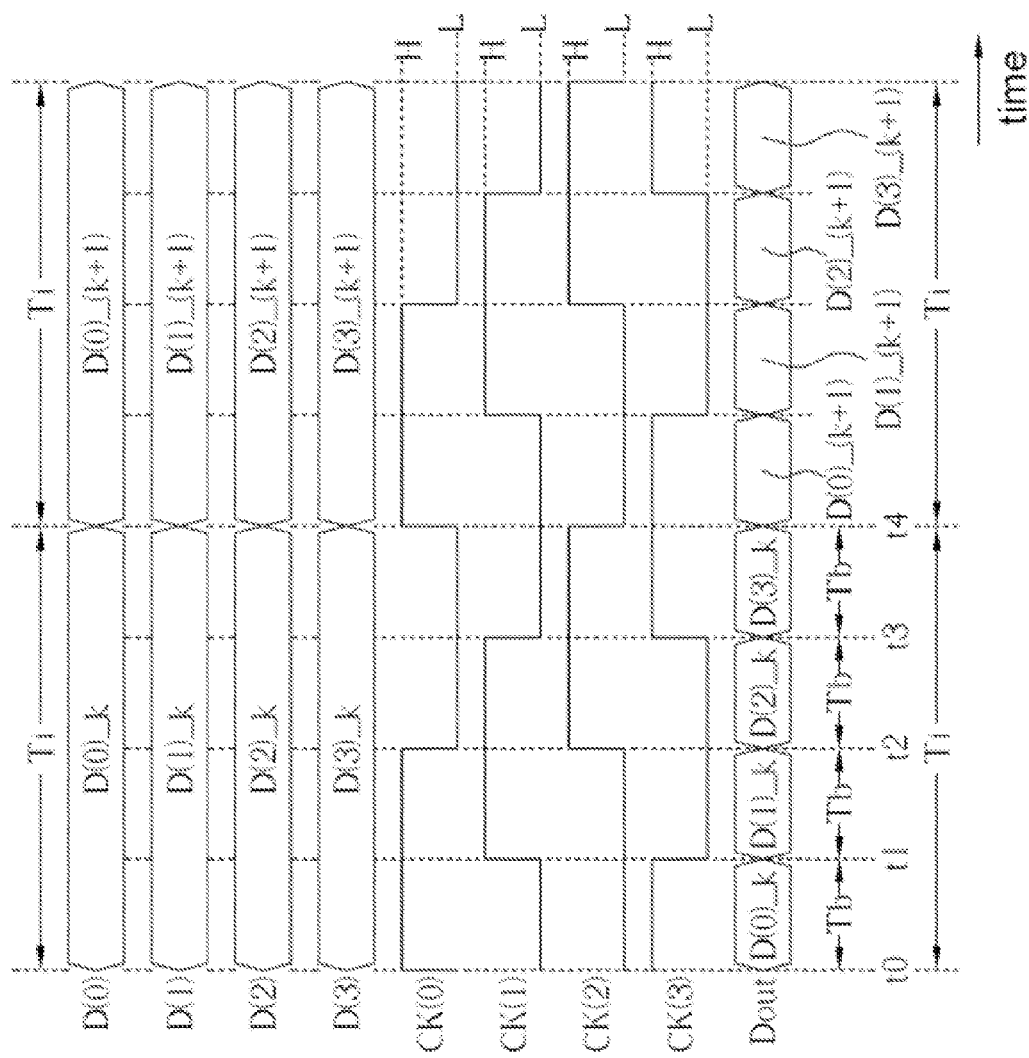
FIG. 4 is a timing diagram of signals and clocks associated with the multiplexer in FIG. 3.

FIG. 3 shows a multiplexer 20 according to an embodiment of the present invention; FIG. 4 shows a timing diagram of signals and clocks associated with the multiplexer 20. The multiplexer of the invention may be an N-to-1 differential multiplexer, which provides a pair of differential signals Dout/Doutb at two outputs at nodes N2 and N2p according to N pairs of differential signals D(0)/Db(0) to D(N−1)/Db(N−1). In FIGS. 3 and 4, a 4-to-1 multiplexer 20 is taken as an example for illustrating an embodiment of the present invention, that is, N=4. The multiplexer 20 comprises N switch circuits dx(0) to dx(N−1), N differential switch circuits dxb(0) to dxb(N−1), and two complementary driving units Mu1 and Mu2.

Each of the switch circuits dx(n) comprises a channel unit M(n) and two switches sa(n) and sb(n). For example, the channel unit M(n) is realized by an NMOS transistor, with its gate, drain and source respectively being regarded as a controlled and an two channel ends. The controlled end receives a clock CK(n) as its channel clock, and one of the channel ends couples to the node N2 and the other couples to a node na(n). As shown in FIG. 2, the clock CK(n) periodically alternates between levels H and L according to the period Ti. When the clock CK(n) is kept at level high (H), the channel unit M(n) conducts the node na(n) to the node N2; when the clock CK(n) is at level low (L), the channel unit M(n) disconnects the node na(n) from the node N2. That is, a period during which the clock CK(n) is at level H is a channel conduction period of the channel unit M(n).

In the switch circuit dx(n) in this embodiment, the switches sa(n) and sb(n) respectively corresponds to input signals D(n) and D(n+1). The switch sa(n) comprises a switch end and two transmission ends—the switch end receives a clock CK(n−1), and the two transmission ends respectively couple to the input signal D(n) and a node na(n). When the clock CK(n−1) is at level H, the switch sa(n) conducts/transmits the input signal D(n) to the node na(n); when the clock CK(n−1) is at level L, the switch sa(n) does not conduct the input signal D(n) to the node na(n). The switch sb(n) also comprises a switch end and two transmission ends—the switch end receives a clock CK(n+1), and the two transmission ends respectively couple to the input signal D(n+1) and a node na(n). When the clock CK(n+1) is at level H, the switch sb(n) conducts/transmits the input signal D(n+1) to the node na(n); when the clock CK(n+1) is at level L, the switch sb(n) does not conduct the input signal D(n+1) to the node na(n). That is, a period during which the clock CK(n−1) is at level H is a switch conduction period of the switch sa(n), and a period during which the clock CK(n+1) is level at H is a switch conduction period of the switch sb(n). For n=(N−1), the input signal D(n+1) is the input signal D(0), and the clock CK(n+1) is the clock CK(0); for n=0, the input signal D(n−1) is the input signal D(N−1), and the clock CK(n−1) is the clock CK(N−1).

As shown in FIG. 4, during a period Ti between t0 and t4, the input signals D(0) to D(3) respectively correspond to the one-bit input data D(0)_k to D(3)_k, respectively. During a next period Ti of the time point t4, the input data D(0) to D(3) respectively correspond to the next input data D(0)_(k+1) to D(3)_(k+1), respectively. For example, each cycle Ti of the clock CK(n) begins at the bit 0 period Tb and ends at the bit (N−1) period Tb, and is kept at level H during bit p and bit q periods and at level L during other periods; wherein p and q are respectively remainders of n and (n+1) divided by N. For example, the clock CK(0) during bit 0 and bit 1 periods Tb from the time points t0 to t2 is kept at level H, the clock CK(1) during bit 1 and bit 2 periods from the time points t1 to t3 is kept at level H, and periods during which the clock CK(0) and the clock CK(2) are at level H are non-overlapping. In this embodiment, the high and low levels between the two clocks CK(0) and CK(2) are thus complementary; that is, within a same period, the clock CK(0) is kept at level H while CK(2) is at level L, and vice versa. Similarly, the clock CK(N−1) (the clock CK(3) in FIG. 4) is at level H during the (N−1) bit period Tb from the time points t3 to t4 and the bit 0 period Tb from the time points t0 to t1.

More specifically, for different clocks CK(n), they have the same cycle/period lengths (frequencies) of but different phases. The periods during which the clock CK(n−1) and the clock CK(n) are at level H are partly overlapped, with the overlapping period being one bit period Tb. The periods during which the clock CK(n−1) and the clock CK(n) are at level L are non-overlapping.

Based on the symmetrical structure of a differential arrangement, the switch circuits dx(n) correspond to the differential switch circuits dxb(n). Each differential switch circuit dxb(n) comprises a channel unit Mb(n) and two switches sc(n) and sd(n). The channel unit Mb(n) is for matching the channel unit M(n), and may also be realized by an NMOS transistor. The channel unit Mb(n) has its source and drain serving as two channel ends, with one coupled to a differential output of a node N2b and the other coupled to the switches sc(n) and sd(n) at a node nb(n). The channel unit Mb(n) controls conduction between the nodes nb(n) and N2b according to the clock CK(n) received at its gate. Similar to the timing of the switch sa(n), the switch sc(n) conducts the invert signal Db(n) of the input signal D(n) according to the clock CK(n−1) to the channel unit Mb(n) at the node nb(n). Likewise, similar to the timing of the switch sb(n), the switch sd(n) conducts the invert signal Db(n+1) of the input signal D(n+1) according to the clock CK(n+1) to the node nb(n).

To correspond to the two channel units M(n) and Mb(n) realized by NMOS transistors, the two complementary driving units Mu1 and Mu2 may be realized by complementary PMOS transistors. The complementary driving unit Mu1 has its gate (a controlled end), drain and source (two channel ends) respectively coupled to the nodes N2b, N2 and the operating voltage Vdd (e.g., a voltage level H). The complementary driving unit Mu2 has its gate, drain and source respectively coupled to the nodes N2 and N2b and the operating voltage Vdd.

Figure 5:
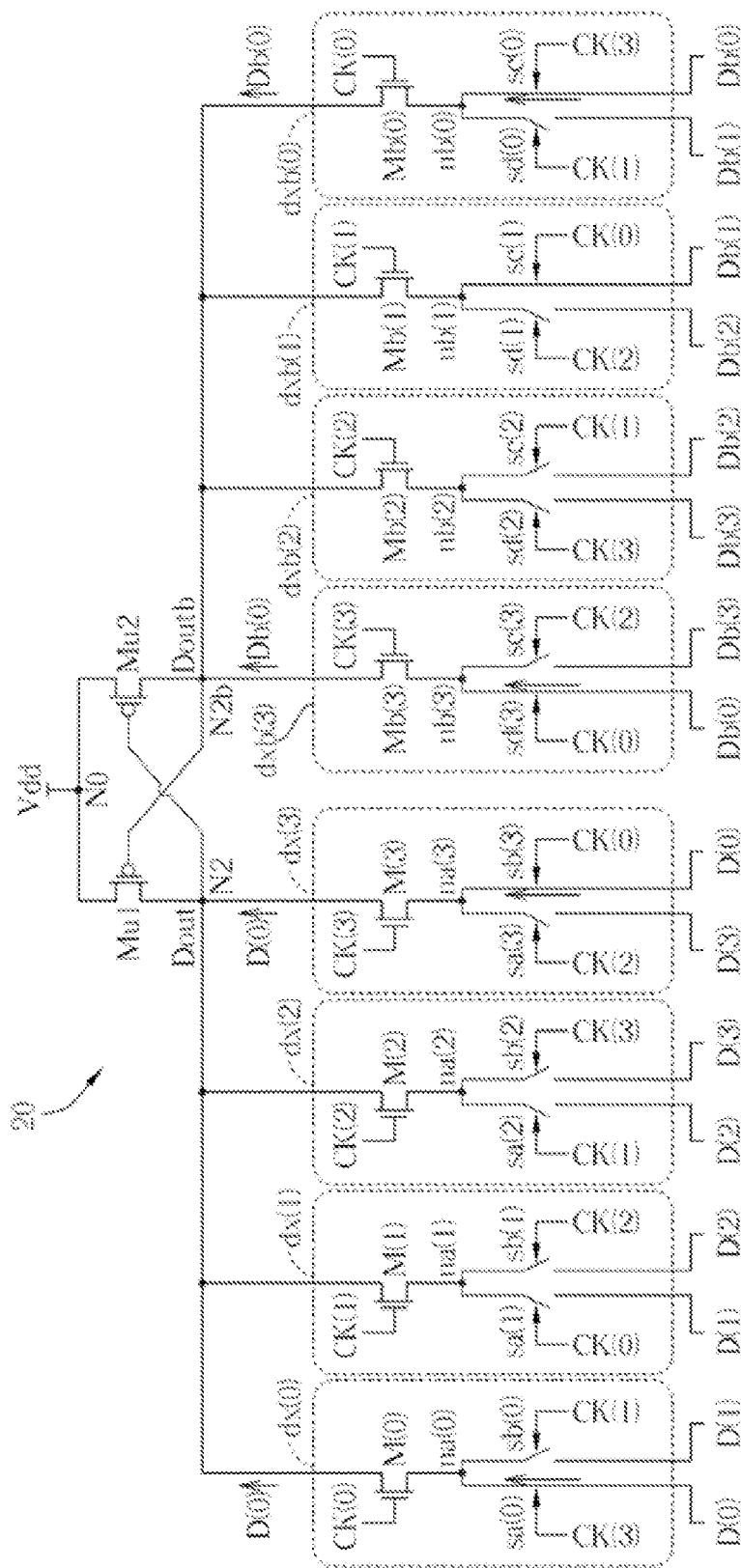
FIGS. 5 and 6 illustrate operations of the multiplexer in FIG. 4.
Figure 6:
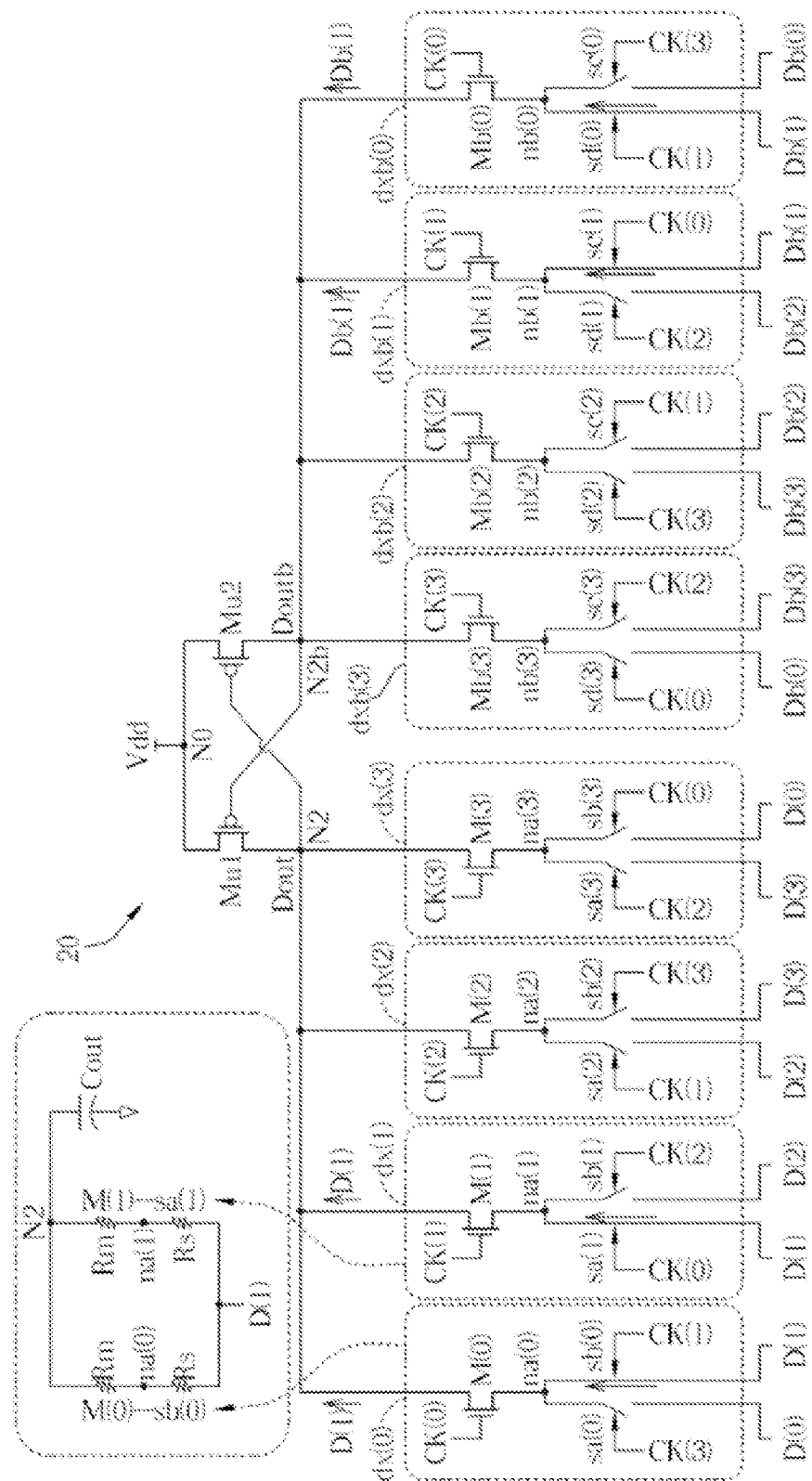

Operations of the multiplexer 20 are given with reference to FIGS. 5 and 6 as well as FIG. 4. At the time points t0 to t1, the clocks CK(0) and CK(3) are at level H, and so the operations of the multiplexer 20 are as illustrated in FIG. 5. More specifically, the channel unit M(0) in the switch circuit dx(0) and the switch sa(0) conduct together to transmit the input signal D(0) to the node N2. Meanwhile, the channel unit M(3) of the switch circuit dx(3) and switch sb(3) both conduct to similarly transmit the input signal D(0) to the node N2. That is, the input signal D(0) is transmitted to the node N2 through two parallel transmission paths, one of which being a path from the switch sa(0) to the channel unit M(0) and the other being a path from the switch sb(3) to the channel unit M(3). Meanwhile, the channel units M(1) and M(2) does not conducted so that the input signals D(1) to D(3) are isolated from node N2.

Under the symmetrical differential structure, the invert input signal Db(0) of the input signal D(0), where Db(0)=$\overline{D(0)}$, is also transmitted to the differential output of the node N2b via two paths. One of the paths is from the switch sc(0) in the switch circuit dxb(0) to the channel unit Mb(0), and the other is from the switch sd(3) in the switch circuit dxb(3) to the channel unit Mb(3).

Between the time points t0 to t1, the differential input signal Db(0) is low level logic 0 when the input signals D(0) is high level logic 1. The input signal Db(0) conducted to the node N2b conducts the complementary driving unit Mu1, and pulls the node N2 to high level logic 1 (i.e., the level of the operating voltage Vdd) so that the output signal Dout at the node 2 follows the input signal D(0) to become logic 1. The complementary driving unit Mu2 is not conducted, such that the differential output signal Doutb from the node Nb2 is also logic 0, which is the same as the input signal Db(0). More specifically, during the period from the time points t0 to t1, the input data D(0)_k of the input signal D(0) is output as the output signal Dout to form a one-bit output data corresponding to a one-bit period Tb.

Between the time points t1 to t2, the clocks CK(0) and CK(1) at the same time are at level H, and operations of the multiplexer 20 are as illustrated in FIG. 6, in which the switch sb(0) in the switch circuit dx(0) conducts with the channel unit M(0) to form a path to transmit the input signal D(1) to the node N2. Meanwhile, the switch sa(1) in the switch circuit dx(1) also conducts with the channel unit M(1) to form another path to similarly transmit bit data in the input signal D(1) to the node N2. That is to say, the input signal Db(1) is also transmitted to the node N2b via two paths. Therefore, during the period from the time points t1 to t2, the differential input signals D(1) and Db(1) respectively correspond to the differential output signals Dout and Doutb, so that a next output data in the output signal Dout is reflected to a bit input data D(1)_k in the input signal D(1).

Similar to operations in FIGS. 5 and 6, between the time points t2 to t3, the input signal D(2) is transmitted to the node N2 via two paths, one of which is from the switch sb(1) in the switch dx(1) to the channel unit M(1), and the other is from the switch sa(2) in the switch circuit dx(2) to the channel unit M(2). Symmetrically, the differential input signal Db(2) is also transmitted to the two paths from the switch sd(1) to the channel unit Mb(1) and from the switch sc(2) to the channel unit Mb(2) to conduct to the node N2. Likewise, between the time points t3 to t4, the input signal D(3) is transmitted via the two paths from the switch sb(2) to the channel unit M(2) and the switch sa(3) to the channel unit Mb(3) to conduct to the node N2, and the differential input signal Db(3) is transmitted via the two paths from the switch sd(2) to the channel unit Mb(2) and the switch sc(3) to the channel unit Mb(3) to the node N2b.

As shown in FIG. 4, during the cycle Ti between the time points t0 to t4, the input bit data D(0)_k to D(3)_k of the input signals D(0) to D(3) are serialized as four output data of the output signal Dout according to the timings of clocks CK(0) to CK(3). In the next cycle Ti which is after the time point t4, the input signals D(0) to D(3) are simultaneously transferred to the next input data D(0)_(k+1) to D(3)_(k+1). The clocks CK(0) to CK(3) repeat the timings of the previous cycle Ti, so that the multiplexer 20 serializes the input data D(0)_(k+1) to D(3)_(k+1) to the next four output data in the output signal Dout.

With the dual-path design in the multiplexer 20 according to an embodiment of the present invention, impedance (resistance) is reduced because the two circuit paths are configured in parallel where the resistance of one path in old design is greater, so that the response speed of the multiplexer 20 is doubled to allow the multiplexer 20 adequately handle speed requirements of high-speed signal multiplexing. FIG. 6 also shows a dual-path equivalent circuit. The input signal D(1) is transmitted via the two paths from the channel unit M(0) to the switch sb(0) and the switch unit M(1) to the switch sa(1). The resistance of the channel units M(0) and M(1) in conduction is equivalent to a resistor Rm, and the resistance of the switches sb(0) and sa(1) is in equivalence a resistor Rs; an output load of the node N2 is in equivalence a capacitor Cout. Supposing the input signal D(0) is only transmitted to the node N2 via a single path, the time constant of the transmission path is Cout*(Rs+Rm). With the dual-path arrangement in the multiplexer of the present invention, the response time constant of the input signal D(1) being transmitted to the node N2 is halved to Cout*(Rs+Rm)/2 since the resistance of the paths becomes (Rs+Rm)/2 due to the parallel connection, meaning that the response speed of the multiplexer 20 is doubled.

Further, one of the two paths in the multiplexer 20 is precharged to again increase the response speed of the multiplexer 20. With reference to FIG. 6, the signal D(1) is transmitted to the node N2 via the two paths from the switch sb(0) to the channel unit M(0) and the switch sa(1) to the channel unit M(1) from the time points t1 to t2 (in FIG. 4). Yet, before the time point t1, the switch sa(1) controlled by the clock CK(0) already conducted the input signal D(1) to the node na(1) in the channel unit M(1). That is, from the time points t0 to t1 before t1 to t2, the node na(1) is pre-charged according to the input signal D(1), so that the input signal D(1) is in advance reflected to the node na(1) between the time points t0 to t1. When the time point t1 is reached, the channel unit M(1) starts to conduct the node na(1) to the node N2, and the input signal D(1) in advance reflected to the node na(1) is immediately responded to the output signal Dout of the node N2. Similarly, the switch sc(1) also pre-charges the node nb(1) according to the input data Db(1).

Further, in the multiplexer 20 according to an embodiment of the present invention, for that the channel conduction period of the channel units M(n) and Mb(n) within each cycle Ti is two bit periods Tb (i.e., the duration that the clock CK(n) remains at level H), the channel response of the channel units M(n) and Mb(n) are not compressed to within one bit period Tb as the transistors Mi(n) and Mib(n) in FIG. 1. This characteristic of the multiplexer of the present invention further satisfies the speed requirements of high-speed signal multiplexing.

It is to be noted further that channel units M(n) and Mb(n) and the two complementary driving units Mu1 and Mu2 in the multiplexer of the present invention are complementary transistor pairs, so that power consumption of the multiplexer is reduced. The reason is that, since the complementary transistor pairs only consume transient power when switching between the data, minimal static power is consumed during the steady-state level when outputting data. Also, under the structure of complementary transistor pairs, the magnitude of signal swings of the output signals Dout and Doutb are kept consistent with that of the input signals D(n) and Db(n).

Figure 7:
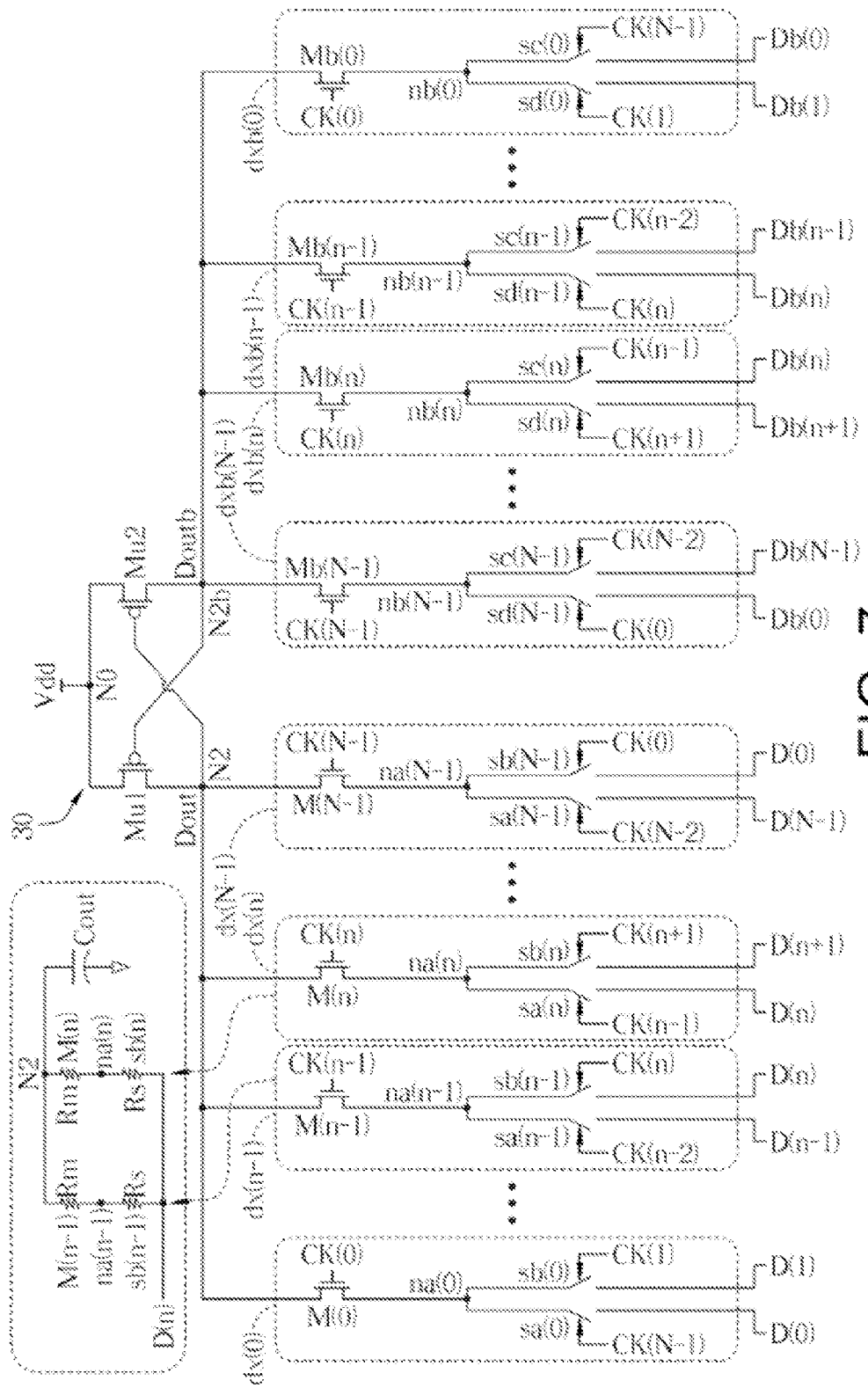
FIG. 7 is a schematic diagram of a multiplexer according to an embodiment of the present invention.
Figure 8:
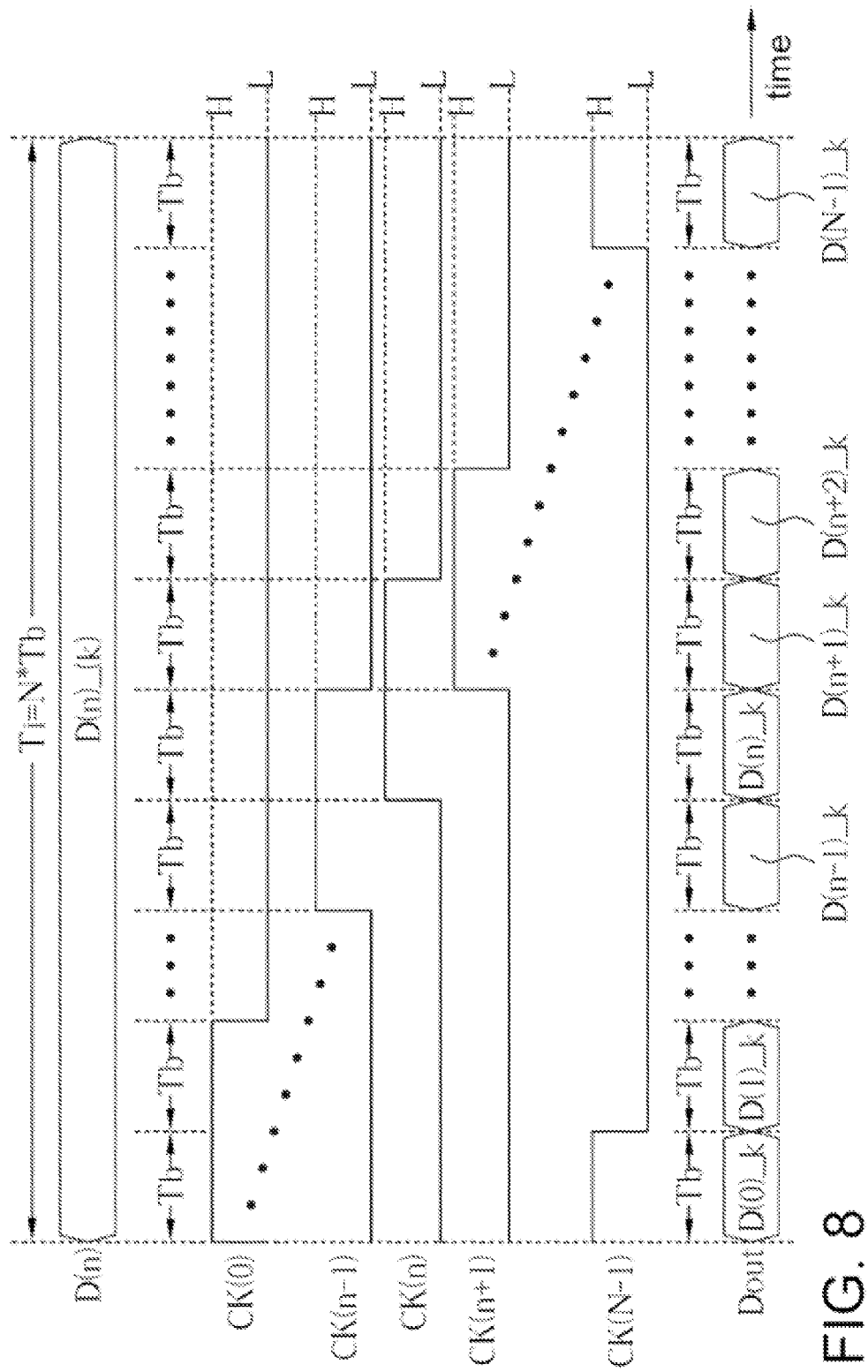
FIG. 8 is a timing diagram of signals and clocks associated with the multiplexer in FIG. 7.

The multiplexer 20 according to an embodiment of the present invention may be developed into a multiplexer 30 illustrated in FIG. 7. The multiplexer 30 is an N-to-1 differential multiplexer, and comprises N switch circuits dx(0) to dx(N−1), N differential switch circuits dxb(0) to dxb(N−1), and two complementary driving units Mu1 and Mu2. The multiplexer 30 provides a pair of differential output signals Dout/Doutb at the nodes N2 and N2b according to the N pairs of differential input signals D(0)/Db(0) to D(N−1)/Db(N−1), respectively. FIG. 8 shows a timing diagram of signals and clocks associated with the multiplexer 30. Each of the bit input data D(n)_k (n=0 to N−1) in the input signal D(n) corresponds to a cycle Ti. The multiplexer 30 operates according to the clocks CK(0) to CK(N−1), and divides N bit periods Tb in each cycle Ti, so as to in sequence transmit the input data D(0)_k to D(N−1)_k in the N bit periods Tb of the output signal Dout.

Each of the clocks CK(0) to CK(N−1) comprises a cycle Ti. In one embodiment, within each cycle Ti, the clock CK(n) begins at the bit 0 period and ends at the (N−1) bit period Tb, and is kept at level H during bit p and bit q periods; wherein p and q are respectively remainders of n and (n+1) divided by N, and n=0 to (N−1).

The complementary driving units Mu1 and Mu2 respectively comprise two channel ends and a controlled end. The complementary driving unit Mu1 has its controlled end and two channel ends respectively coupled to the nodes N2b, N0 and N2; the complementary driving unit Mu2 has its controlled end and two channel ends respectively coupled to the nodes N2, N0 and N2b. The node N0 is coupled to the operating voltage Vdd (such as the voltage level H).

For n=0 to (N−1), each switch circuit dx(n) comprises a channel unit M(n) and two switches sa(n) and sb(n). The channel unit M(n) is coupled between the nodes na(n) and N2. Based on the symmetrical structure of the differential circuit configuration, each differential circuit dxb(n) comprises a channel unit Mb(n) and two switches sc(n) and sd(n). The channel unit Mb(n) is coupled between the nodes nb(n) and N2b. When the clock CK(n) is at level H, the channel unit M(n) conducts the node na(n) to the node N2, and the channel unit Mb(n) conducts the node nb(n) to the node N2b. When the clock CK(n) is at level L, the channel unit M(n) stops conducting the node na(n) to the node N2, and the channel unit Mb(n) stops conducting the node nb(n) to the node N2b.

For n=0, the switches sa(0) and sb(0) in the switch circuit dx(0) transmit the input signals D(0) and D(1) to the node na(0) according to the level H periods in the clocks CK(N−1) and CK(1). For n=1 to (N−2), the switches sa(n) and sb(n) in the switch circuit dx(n) transmit the input signals D(n) and D(n+1) to the node na(n) according to the clocks CK(n−1) and CK(n+1). For n=(N−1), the switches sa(N−1) and sb(N−1) in the switch circuit dx(N−1) transmit the input signals D(N−1) and D(0) to the node na(N−1) according to the clocks CK(N−2) and CK(0). Symmetrically, the switches sc(0) and sd(0) in the switch circuit dxb(0) transmit the input signals Db(0) and Db(1) to the node nb(0) according to the clocks CK(N−1) and CK(1); the switches sc(N−1) and sd(N−1) in the switch circuit dxb(N−1) transmit the input signals Db(N−1) and Db(0) to the node nb(N−1) according to the clocks CK(N−2) and CK(0). For n=1 to (N−2), the switches sc(n) and sd(n) of the switch circuit dxb(n) transmit the input signals Db(n) and Db(n+1) according to the clocks CK(n−1) and CK(n+1).

With the above arrangement of the clocks, the input signals D(0) to D(N−1), Db(0) to Db(N−1) are respectively transmitted to the nodes N2 and N2b via the two paths during the corresponding bit periods Tb. When the clocks CK(0) and CK(N−1) are at level H, the input signal D(0) is transmitted to the node N2 via the two paths from the switch sa(0) to the channel unit M(0) and from the switch sb(N−1) to the channel unit M(N−1), and the invert input signal Db(0) is transmitted via the two paths from the switch sc(0) to the channel unit Mb(0) and from the switch sd(N−1) to the channel unit Mb(N−1) to the node N2b. For n=1 to (N−1), when the clocks CK(n−1) and CK(n) are at level H, the input signal D(n) is transmitted via the two paths from the switch sa(n) to the channel unit M(n) and from the switch sb(n−1) to the channel unit M(n−1) to the node N2, and the invert signal Db(n) is transmitted via the two paths from the switch sc(n) to the channel unit Mb(n) and from the switch sd(n−1) to the channel unit Mb(n−1) to the node N2b.

The equivalent impedance (resistance) of the two paths are connected in parallel to form a low-impedance path, so that transmission delay is shortened to increase a response speed of the multiplexer of the present invention. As shown in FIG. 7, when the input signal D(n) is transmitted via the two paths from the switch sb(n−1) to the channel unit M(n−1) and from the switch sa(n) to the channel unit M(n) in the multiplexer 30 to the equivalent load capacitor Cout of the node N2, the equivalent resistance of two single paths seen in parallel becomes (Rm+Rs)/2, where equivalent resistance in each single path is Rm+Rs (respective conductance resistance of the channel unit and the switch), so that the input signal D(n) is transmitted to the node N2 via the transmission with halved resistance. Further, before the clocks CK(n−1) and CK(n) are at level H, the input signal D(n) is transmitted by the switch sa(n) to the corresponding channel unit M(n) to pre-charge the channel unit M(n), thereby again enhancing the performance of the multiplexer 30 in high-speed signal multiplexing.

Figure 9:
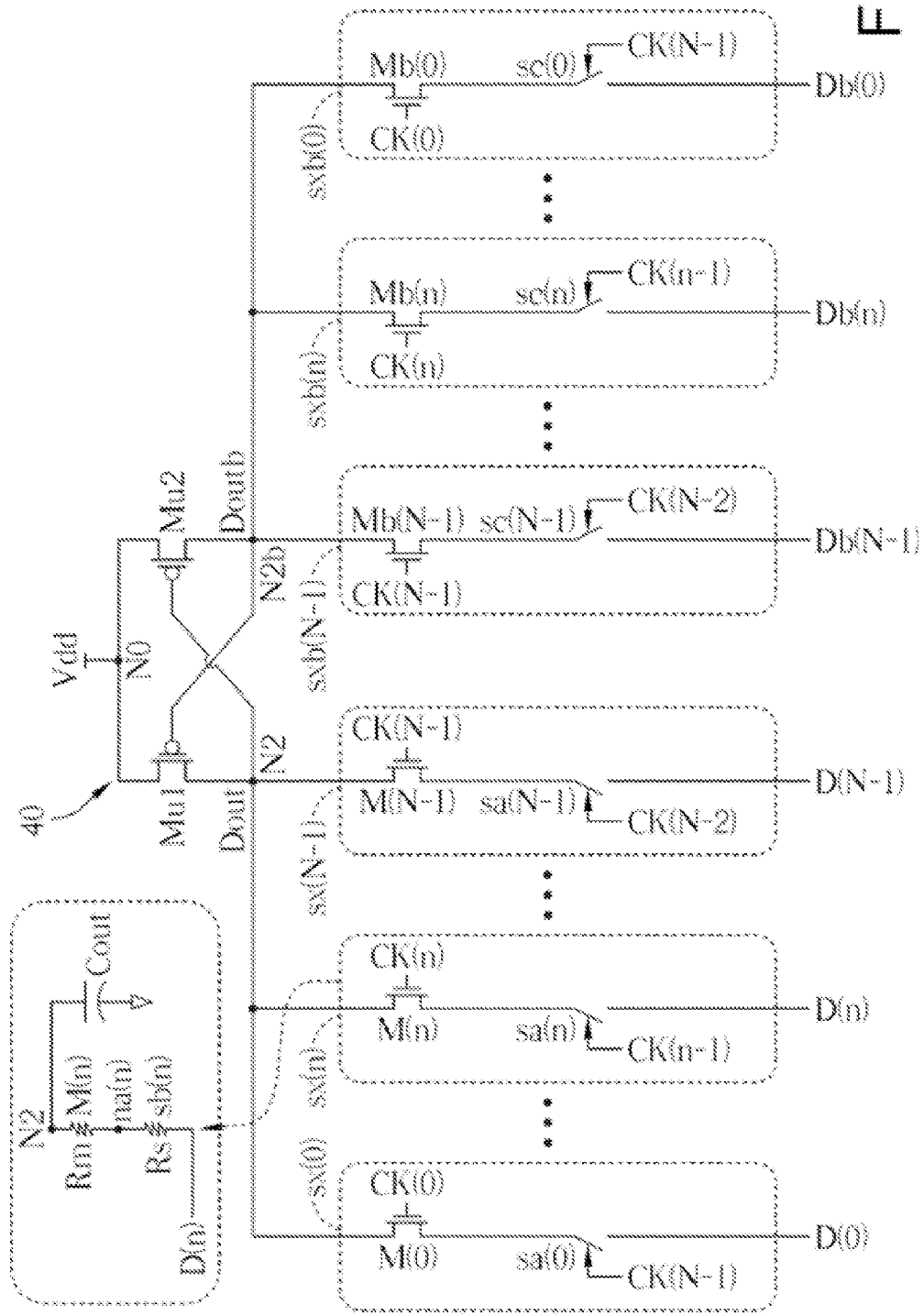
FIG. 9 is a schematic diagram of another conventional multiplexer.

FIG. 9 shows a multiplexer 40, which is to be described below in comparison to the multiplexer 30. The multiplexer 40 is also an N-to-1 differential multiplexer, and provides a pair of differential output signals Dout/Doutb at the nodes N2 and N2b according to N pairs of differential input signals D(0)/Db(0) to D(N−1)/Db(N−1). The multiplexer 40 comprises N switch circuits sx(0) to sx(N−1), N differential switch circuits sxb(0) to sxb(N−1), and two complementary driving units Mu1 and Mu2. Signals and clocks associated with the multiplexer 40 are the same as those shown in FIG. 8. The multiplexer 40 similarly operates according to the clocks CK(0) to CK(N−1) to in sequence serialize the input data D(0)_k to D(N−1)_k during the N bit period of the cycle Ti.

Each of the switch circuits sx(n) in the multiplexer 40 comprises a channel unit M(n) and a switch sa(n). The channel unit M(n) controls the conduction of the switch sa(n) to the node N2, and the switch sa(n) controls the conduction of the received input signal D(n) to the channel unit M(n). Symmetrically, the differential switch circuit sxb(n) comprises a channel unit Mb(n) and a switch sb(n) to correspond to an input signal Db(n). For n=1 to (N−1), the channel units M(n) and Mb(n) are conducted when the clock CK(n) is at level H, and the switches sa(n) and sb(n) are conducted when the clock CK(n−1) is at level H. For n=0, the channel units M(0) and Mb(0) are conducted when the clock CK(0) is at level H, and the switches sa(0) and sb(0) are conducted when the clock CK(N−1) is at level H.

Therefore, when the clocks CK(n−1) and CK(n) are at level H, the input signal D(n) is transmitted to the node N2 via the single path from the channel unit M(n) to the switch sa(n). More specifically, the input signal D(n) is transmitted through the channel unit M(n) and the switch sa(n) which together having a conducting resistance (Rm+Rs) to the node N2 which has the equivalent load capacitor Cout, so that the delay of the input signal D(n) transmitted to the node N2 may be represented by a time constant (Rm+Rs)*Cout. Hence, the dual-path design of the multiplexer 30 shown in FIG. 7 is capable of reducing the time constant to (Rm+Rs)*Cout/2, meaning that the multiplexer 30 is provided with an even faster speed more suitable for applications of high-speed signal multiplexing.

Comparing the multiplexer 40 in FIG. 9 with the multiplexer 30 in FIG. 7, since channel unit M(n) only needs to transmit the input signal D(n) in one bit period Tb, the channel unit M(n) in the multiplexer 30 may utilize another bit period Tb to transmit another input signal D(n+1). Thus, each input signal D(n) is allocated with two channel units M(n−1) and M(n) to form two paths to enhance speed and performance of the multiplexer 30. Supposing a layout area of the channel unit M(n) is Am and that of the switch sa(n) or sb(n) is As, a layout area of a single path in the multiplexer 40 is then Am+2As(≈2Am). In comparison, a layout area of a single path in the multiplexer 30 is Am+2As(≈3Am), however with a time constant (delay) being only a half of that of the single path. Considering that the multiplexer 30 provides a doubled output speed (i.e., a bit count transmitted within unit time), a total layout area of the multiplexer 30 is 3Am*N, and that of the multiplexer 40 is 2Am*N. In other words, under the same output frequency, the layout area of the multiplexer 30 is only a half of 3Am*N, which is smaller than the layout are 2Am*N of the multiplexer 40, meaning that the multiplexer 30 provides better performance than the multiplexer 40 with respect to each unit area.

In the multiplexer 30 in FIG. 7, for example, the channel units M(n) and Mb(n) are realized by NMOS transistors, the complementary driving units Mu1 and Mu2 are realized by PMOS transistors, and the switches sa(n), sb(n), sc(n) and sd(n) are realized by NMOS transistors or complementary MOS transistor pairs (e.g., transmission gates).

Figure 10:
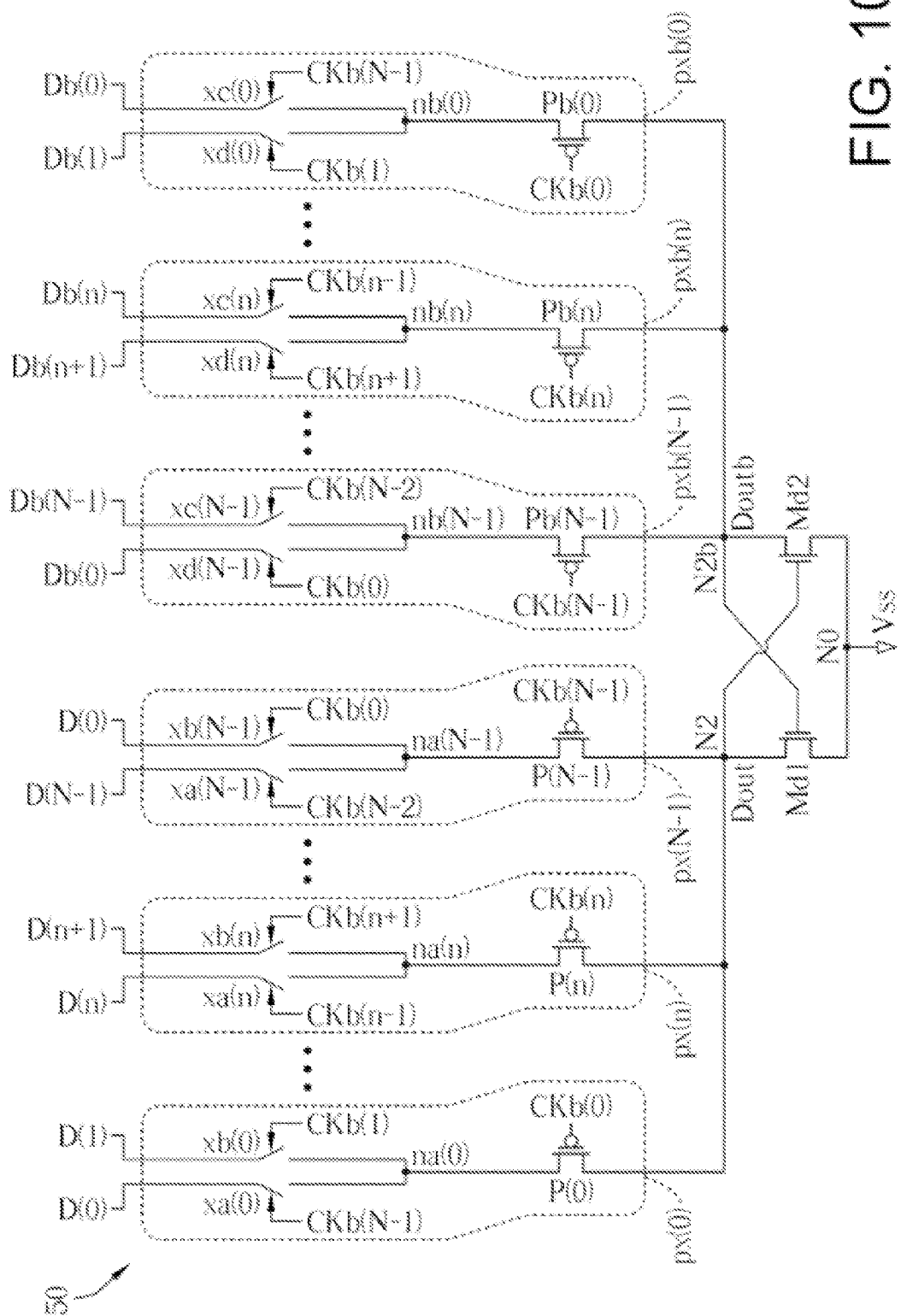
FIG. 10 is a schematic diagram of a multiplexer according to an embodiment of the present invention.
Figure 11:
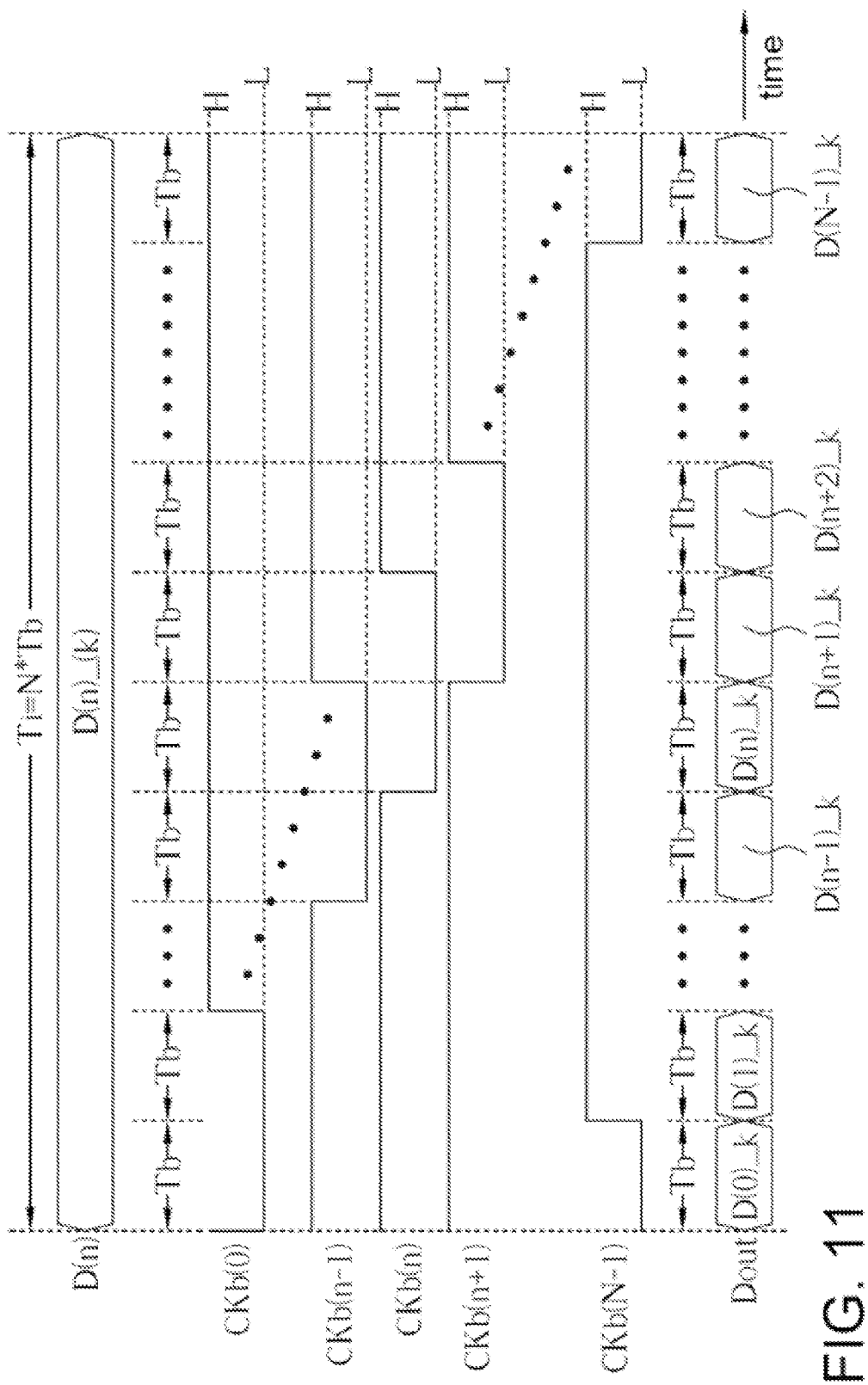
FIG. 11 is a timing diagram of signals and clocks associated with the multiplexer in FIG. 10.

Based on complementary duality, another embodiment is developed from the multiplexer 30. FIG. 10 shows a schematic diagram of a multiplexer 50 according to another embodiment of the present invention; FIG. 11 shows a timing diagram of signals and clocks associated with the multiplexer 50 in operation. The multiplexer 50 is an N-to-1 differential multiplexer, and provides a pair of differential output signals Dout/Doutb at two outputs at nodes N2 and N2b according to N differential input signal pairs D(0)/Db(0) to D(N−1)/Db(N−1). The input signals D(0) to D(N−1) are synchronous, and one of bit input data D(0)_k to D(N−1) in the input signals corresponds to a cycle Ti. The multiplexer 50 serializes the input data D(0)_k to D(N−1)_k to the output data Dout in N bit periods Tb of a cycle Ti according to the clocks CKb(0) to CKb(N−1). Each of the clocks CKb(0) to CKb(N−1) comprises a cycle Ti. In an embodiment, the clock CK(n) begins at the bit 0 period Tb and ends at the bit (N−1) period Tb, and is kept at level L during bit p and bit q periods and at level H during other periods in each cycle Ti; wherein p and q are respectively remainders of n and (n+1) divided by N, and n=0 to (N−1).

The multiplexer 50 comprises complementary driving units Md1 and Md2, N switch circuits px(0) to px(N−1), and N differential switch circuits pxb(0) to pxb(N−1). The complementary driving units Md1 and Md2 (e.g., realized by NMOS transistors) respectively comprise a controlled end (e.g., a gate) and two channel ends (e.g., a source and a drain). The complementary driving unit Md1 has its controlled end and two channel ends respectively coupled to the nodes N2b, N0 and N2; the complementary driving unit Md2 has its controlled end and two channel ends respectively coupled to the nodes N2, N0 and N2b. The node N0 is coupled to the operating voltage Vss (e.g., a voltage level L).

For n=0 to (N−1), each switch circuit px(n) comprises a channel unit P(n) and two switches xa(n) and xb(n). The channel unit P(n) is coupled between the nodes na(n) and N2. Based on the symmetrical structure of a differential arrangement, each differential switch circuit pxb(n) comprises a channel unit Pb(n) and two switches xc(n) and xd(n). The channel unit Pb(n) is coupled between the nodes nb(n) and N2b. When the clock CKb(n) is at level L, the channel unit P(n) conducts the node na(n) to the node N2, and the channel unit Pb(n) conducts the node nb(n) to the node N2b.

For n=0, the switches xa(0) and xb(0) in the switch circuit px(0) respectively transmit the input signals D(0) and D(1) to the node na(0) according to a level L period of the clocks CKb(N−1) and CKb(1). For n=1 to (N−2), the switches xa(n) and xb(n) in the switch circuit px(n) respectively transmit the input signals D(n) and D(n+1) to the node na(n) according to the clocks CKb(n−1) and CKb(n+1). For n=(N−1), the switches xa(N−1) and xb(N−1) in the switch circuit px(N−1) respectively transmit the input signals D(N−1) and D(0) to the node na(N−1) according to the clocks CKb(N−1) and CKb(0). Symmetrically, the switches xc(0) and xd(0) in the switch circuit pxb(0) respectively transmit the signals Db(0) and Db(1) to the node nb(0) according to the clocks CKb(N−1) and CKb(1); the switches xc(N−1) and xd(N−1) in the switch circuit pxb(N−1) respectively transmit the input signals Db(N−1) and Db(0) according to the clocks CKb(N−2) and CK(0). For n=1 to (N−2), the switches xc(n) and xd(n) in the switch circuit pxb(n) respectively transmit the input signals Db(n) and Db(n+1) to the node nb(n) according to the clocks CKb(n−1) and CKb(n+1).

The multiplexer 50 similarly provides a dual-path design when switching between the input signals. When the clocks CKb(0) and CKb(N−1) are at level L, the input signal D(0) is transmitted to the node N2 by two paths from the switch xa(0) to the channel unit P(0) and from the switch xb(N−1) to the channel unit P(N−1), and the invert input signal Db(0) is transmitted to the node N2b via two paths from the switch xc(0) to the channel unit Pb(0) and from the switch xd(N−1) to the channel unit Pb(N−1). For n=1 to (N−1), when the clocks CKb(n−1) and CKb(n) are at level L, the input signals D(n) is transmitted to the node N2 via the two paths from xa(n) to the channel unit P(n) and from the switch xb(n−1) to the channel unit P(n−1), and the invert input signal Db(n) is transmitted to the node N2b via the two paths from the switch xc(n) to the channel unit Pb(n) and from the switch xd(n−1) to the channel unit Pb(n−1).

As stated previously, for example, the driving units Md1 and Md2 are realized by NMOS transistors, the channel units P(n) and Pb(n) are correspondingly realized by PMOS transistors, and the switches xa(n), xb(n), xc(n) and xd(d) are realized by PMOS transistors or complementary MOS transistor pairs (e.g., transmission gates).

With the dual-path design in the multiplexer of the present invention, an input signal is transmitted to the output via the dual-paths of the switching mechanism to achieve pre-charging as well as reducing impedance (resistance) and delay to thereby increase a response speed of the multiplexer For the channel units and switches performing the multiplexing, corresponding conduction periods are two bit periods Tb without having to compress conduction response to within one bit period Tb, so that the multiplexer of the present invention is capable of adequately handling speed requirements of high-speed signal multiplexing. Further, in addition to reducing power consumption of the multiplexer of the present invention by realizing the channel units and complementary driving units by complementary transistor pairs, the magnitude of signal swings of the output signals and are kept consistent with that of the input signals.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multiplexer, comprising:
   an output that provides an output signal; and
   a plurality of switch circuits that receive a plurality of input signals, each switch circuit comprising:
      a channel unit, coupled to the output, being conducted during a channel conduction period;
      a plurality of switches coupled to the channel unit, each switch corresponding and coupled to one of the input signals, the switches respectively being conducted in a plurality of switch conduction periods;
   a differential output that outputs a differential output signal according to the input signals;
   a plurality of differential switch circuits, each differential switch circuit comprising:
      a channel unit, comprising a first channel end being coupled to the differential output and a second channel end, that conducts the first channel end to the second channel end during a channel conduction period; and
      a predetermined number of switches, each switch corresponding to a respective one of the input signals, each switch comprising two transmission ends respectively coupled to the second channel end and an invert signal associated with the respective input signal, each switch having a switch conduction period during which the switch conducts the two transmission ends;
   a first complementary driving unit, comprising a controlled end and a channel end respectively coupled to the output and the differential output; and
   a second complementary driving unit, comprising a controlled end and a channel end respectively coupled to the differential output and the output,
   wherein, the switch conduction periods and the channel conduction period in each switch circuit are partly overlapped, and the switch conduction periods in each switch circuit are non-overlapped.

2. The multiplexer according to claim 1, wherein each channel unit comprises a first channel end and a second channel end with the first channel end coupled to the output, and wherein each switch comprises two transmission ends, respectively coupled to one of the input signals and the second channel end, such that the switch conducts the two transmission ends in the corresponding switch conduction period.

3. The multiplexer according to claim 1, wherein the switches in each switch circuit respectively correspond to different input signals among the input signals.

4. The multiplexer according to claim 1, wherein each output signal comprises a plurality of output data, each output data associated with a respective bit period, wherein respective durations of the channel conduction period and the switch conduction periods are twice a duration of a bit period, and a time during which the switch conduction periods overlap with the channel conduction period equals the bit period.

5. The multiplexer according to claim 4, wherein each input signal comprises a plurality of input data, each input data associates with a plurality of the bit periods.

6. The multiplexe according to claim 1, wherein the switch circuits comprise a first switch circuit and a second switch circuit, each of the first and second switch circuits respectively comprises a first switch and a second switch, wherein the channel conduction period of the first switch circuit equals the switch conduction period of the first switch in the second switch circuit, and wherein the channel conduction period of the second switch circuit equals the switch conduction period of the second switch in the first switch circuit.

7. The multiplexer according to claim 6, wherein the input signals comprise a first input signal, a second input signal, and a third input signal, wherein the first switch and the second switch of the first switch circuit respectively receive the first input signal and the second input signal, and wherein the first switch and the second switch of the second switch circuit respectively receive the second input signal and the third input signal.

8. The multiplexer according to claim 6, wherein the switch conduction period of the first switch of the first switch circuit is non-overlapping with the switch conduction period of the second switch of the first switch circuit.

9. The multiplexer according to claim 1, wherein each channel unit further receives a channel clock that alternates between a first level and a second level with the channel conduction period corresponding to the first level of the channel clock, and wherein each switch further receives a switch clock that alternates between a third level and a fourth level with the switch conduction period of each switch corresponding to the third level of the switch clock.

10. The multiplexer according to claim 9, wherein each channel clock periodically alternates between the first level and the second level, wherein each switch clock periodically alternates between the third level and the fourth level that are respectively equal to the first level and the second level of the channel conduction period, and wherein a channel clock phase is different from a switch clock phase in each switch circuit.

11. The multiplexer according to claim 1, wherein each differential switch circuit corresponds to one of the switch circuits, wherein the switch conduction period of each switch circuit equals to a conduction period of the corresponding differential switch circuit, and wherein the switch conduction period of each switch in each switch circuit equals to the conduction period of the predetermined number of switches of the corresponding differential switch circuit.

* * * * *